Figure 1:
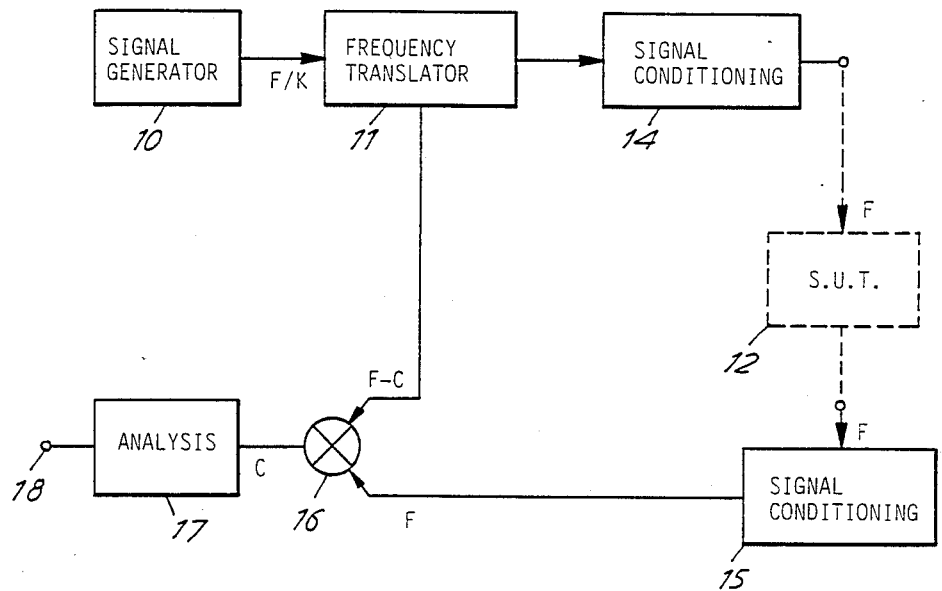

United States Patent [19]

Sayers et al.

[11] Patent Number: 4,916,383

[45] Date of Patent: Apr. 10, 1990

[54] FREQUENCY RESPONSE ANALYSIS

[75] Inventors: Brian Sayers, Farnborough; Alan Ryder, Hants; Steve Outram, Surrey, all of England

[73] Assignee: Schlumberger Technologies Limited, England

[21] Appl. No.: 344,927

[22] Filed: Apr. 28, 1989

[30] Foreign Application Priority Data

Apr. 29, 1988 [GB] United Kingdom ................ 8810321

[51] Int. Cl.⁴ ............................................. G01R 23/14
[52] U.S. Cl. .................................. 324/605; 324/79 R; 324/77 B
[58] Field of Search ................. 324/78 R, 77 R, 57 R, 324/77 B, 79 R

[56] References Cited

U.S. PATENT DOCUMENTS 3,445,762  3/1963  Wu ........................................ 324/79 R
4,510,440  4/1985  Ryder ................................... 324/77 R
4,716,363  12/1987  Dukes et al. ....................... 324/78 R Primary Examiner—Reinhard J. Eisenzopf
Assistant Examiner—Maura Regan
Attorney, Agent, or Firm—Lowe, Price, LeBlanc, Becker & Shur

[57] ABSTRACT

In a frequency response analyzer capable of testing a system under test at a higher frequency F derived from a signal generator providing a relatively higher frequency F/K. A reference signal of frequency F−C is supplied to a mixer where it is multiplied with the return signal of frequency F to provide a fixed frequency output C. An analyzing portion of the frequency response analyzer is therefore required to operate only at this fixed frequency C and may provide an output in any suitable form, for example displays of magnitude and phase against frequency as F/K is varied. The present invention overcomes the problem of providing a VCO based signal generator capable of operation at very low frequencies.

2 Claims, 2 Drawing Sheets

FREQUENCY RESPONSE ANALYSIS

This invention relates to frequency response analysis, and in particular to the testing the response of a system to an input signal at a relatively high frequency and over a wide range of frequencies.

Frequency response analysis, in which the input signal applied to a system is compared with the output signal from the system at various frequencies, is a well-known technique for characterising the behaviour of, for example, servo systems, rotating machinery, electric and electronic circuits and elastic and viscous materials. The output signal is often analysed by correlating it with reference signals which are in phase and in quadrature phase with the input signal to the system.

In order to permit testing of systems at frequencies above the range of operation of standard correlators, it is also known to mix (or multiply) the output signal from the system under test with an offset signal whose frequency is spaced from the frequency of the input signal applied to the system by an amount equal to the frequency of the desired signal for application to the correlator. The mixing process produces two beat or heterodyne signals, the required one at the difference of the output and offset signal frequencies and an unwanted one (the image signal) at the sum of those frequencies.

At the heart of a frequency response analyser, therefor, is a frequency synthesiser which produces a signal at a starting frequency which produces a frequency component on which the correlator may operate when later divided and mixed; a reference for the correlator being derived by division of this starting frequency.

A straightforward system may be configured using a starting frequency of NF for an input signal to the system under test frequency F, using a divider of N for the input and N+1 (or N−1) for the offset. Thus the offset signal will be at a frequency FN/(N+1). The heterodynes produced by the mixing process are thus the required one at F/(N+1) and the unwanted image one at F(2N+1)/(N+1).

The reference signals for the correlator are typically derived from the offset signal via another divide-by-N divider, to produce signals at F/(N+1), the same frequency as the lower of the two heterodyne signals. The correlation process is such that its response is at a maximum at the reference signal frequency and, theoretically, zero at all harmonics of the reference signal frequency. However, the quantised nature of the (digital) correlation process results in reality in a non-zero spurious response at certain harmonic frequencies.

It has been found that it is beneficial to generate an offset with a frequency of F(h−1)/h, where h is a heterodyne ratio independent of the input signal division ratio N. A method and apparatus for frequency response analysis based upon this approach is described in United Kingdom Patent Specification GB No. 2 110 826B.

Such an offset technique is effective to extend the operating range of a frequency response analyser well beyond the frequency of operation of practically realisable correlators, for example up to about 60 kHz. There is requirement to extend the operational range of analysers even higher, for example into the MHz range. Such extension cannot be achieved with prior art offset analysers since frequency synthesizer speed limitations are encountered. A clear example is where a digital synthesizer is employed, which itself would typically have a clock frequency of only 10 MHz and be unable to generate a signal of frequency NF, since even F might be in excess of the frequency of the synthesizer clock. It has recently been proposed to extend the range of such synthesizers by various techniques, such as phase locked loops.

Whatever means of offset or synthesis is chosen, a variable frequency signal is eventually derived for application to the correlator together with the reference in phase and quadrature signal. Thus the correlator is required to perform its analysis across a range of frequencies chosen commensurate with the range of frequencies to be tested. In broad range high frequency response analysers, it may be the range of the correlator which ultimately sets a limit on the overall operating range which can be provided.

It is known in radio frequency signal processing that a signal for demodulation at a constant intermediate frequency may be provided by mixing a variable frequency local oscillator signal with an incoming signal and adjusting the local oscillator frequency to give the required difference frequency after mixing. Fixed frequency demodulation may then occur. It is an object of the present invention to provide a frequency response analyser operable in excess of the maximum analysing frequency that can be directly generated by the analyser with the analysing portion, for example the correlator, being limited to a fixed frequency input.

According to the present invention a frequency response analyser for testing the response of a system under test at a relatively higher frequency F having a signal generator portion capable of generating a reference signal at a relatively lower frequency F/K includes:

a phase locked loop comprising a phase sensitive detector to which the reference signal is applied at a reference input, a voltage controlled oscillator arranged to provide a signal of a frequency being a multiple of the reference signal frequency, but offset in frequency and a divider for dividing by said multiple to generate a signal of frequency F/K from a signal of frequency F connected to a comparison input of the voltage controlled oscillator, means for generating a fixed frequency signal of the frequency offset of the voltage controlled oscillator, mixing means intermediate the voltage controlled oscillator and divider of the phase locked loop arranged to receive the fixed frequency at its mixing input, the output of the mixing means being provided to the system under test, means for generating a second signal of constant frequency, being a frequency of operation of an analysing portion of the frequency response analyser offset by an amount equal to the offset of the voltage controlled oscillator output, second mixing means arranged to receive said second signal and the voltage controlled oscillator output signal, and, third mixing means arranged to receive the output of said second mixing means and a signal from the system under test, the third mixing means providing an output for analysis of frequency C to said analysing portion.

Preferably, the means for generating said second signal comprises a second phase locked loop having a second phase sensitive detector receiving a signal of said analysing frequency C, and a second voltage controlled oscillator arranged to provide a signal offset in frequency in response to an error signal received from the second phase sensitive detector, the error signal being generated by applying to the comparison input of the second phase sensitive detector the output signal of a fourth mixer receiving at its inputs the output of the second voltage controlled oscillator and the fixed frequency signal of the offset frequency, L.

Figure 2:
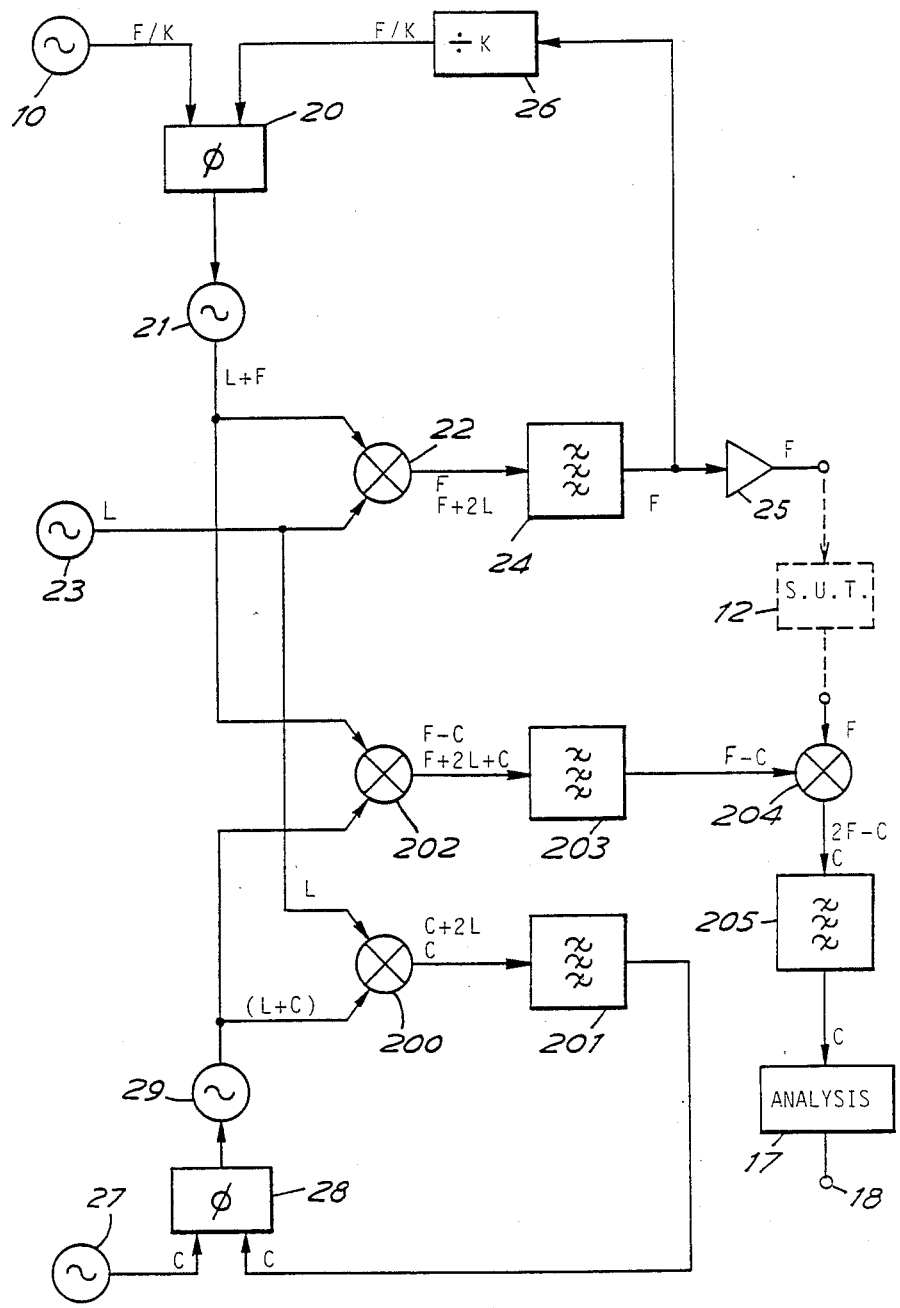

In order that features and advantages of the present invention may be further appreciated an embodiment will now be described by way of example only and with reference to the accompanying diagrammatic drawings of which:

FIG. 1 represents the arrangement of a frequency response analyser in accordance with the present invention, and FIG. 2 represents the embodiment of FIG. 1 in more detail.

In a frequency response analyser (FIG. 1) a signal generator 10 provides a reference signal at a frequency F/K. Since this frequency is below that required for testing, a frequency translator 11 provides a signal at a multiple frequency F which is fed as an excitation signal to the System Under Test 12 via signal conditioning circuitry 14. The objective of frequency response analysis is to analyse the component at frequency F (in magnitude and phase for example) in the return signal received at signal conditioning circuitry 15 from the system under test as a result of the excitation. In prior art frequency response analysers, the return signal is analysed (for example by correlation) with respect to a reference signals of frequency F supplied from the frequency translator; the analysis portion of such a prior art frequency response analyser is thus required to operate over a board frequency range, commensurate with the range to be tested. In the frequency response analyser of FIG. 1 and in accordance with the present invention, a reference signal of frequency F−C is supplied to a mixer 16 where it is multiplied with the return signal of frequency F to provide a fixed frequency output C. Analysing portion 17 of the frequency response analyser is therefore required to operate only at this fixed frequency C and may provide an output 18 in any suitable form, for example displays of magnitude and phase against frequency as F/K is varied.

The embodiment of the present invention will now be described in more detail.

Reference frequency F/K generated by signal generator 10 (FIG. 2) is fed to an input of a phase sensitive detector 20. The error signal output of the phase sensitive detector 20 controls a voltage controlled oscillator 21 to provide an output at a multiple K of the analysing signal, offset in frequency by an amount L. The output of voltage controlled oscillator 21 is thus of frequency (L+F). This output is connected to a first input of a mixer 22. A signal generator 23 generates a signal of a frequency L, being the frequency offset of the voltage controlled oscillator 21, which is connected to the second input of the mixer 22, which thus provides outputs of frequency F and (F+2L). A low pass filter 24 is arranged to remove the upper side band, so a signal of frequency F may be conditioned by an amplifier 25 and fed to the system under test 12. The output of low pass filter 24 is also divided by the multiplying factor K in a divider 26 to provide a signal of frequency F/K which is connected to the comparison input of the phase sensitive detector 20. It will be apparent that phase sensitive detector 20, voltage controlled oscillator 21, low pass filter 24 and divider 26 constitute a phase locked loop so that the excitation signal provided by amplifier 25 is continuously maintained at F.

A signal generator 27 provides a fixed frequency reference signal of frequency C to a phase sensitive detector 28. An error signal from phase sensitive detector 28 controls a voltage controlled oscillator 29 to provide a signal at a frequency offset by L, that is of frequency (C+L). The output of voltage controlled oscillator 29 is received at the first input of a mixer 200, the signal at the second input of mixer 200 being of frequency L supplied by generator 23. The output of mixer 200 therefore provides sidebands at frequencies of (C+2L) and C. A low pass filter 201 removes the upper sideband to provide a signal of frequency C which is applied to the comparison input of phase sensitive detector 28. It will be apparent that phase sensitive detector 28, voltage controlled oscillator 29 and low pass filter 201 constitute a second phase locked loop so that the output of second voltage controlled oscillator 29 is continuously maintained at the offset frequency (C+L).

A mixer 202 receives the outputs of voltage controlled oscillator 21 (L+F) and second voltage controlled oscillator 29 (C+L) to provide product outputs of frequency (F+2L+C) and (F−C). The upper sideband is removed by low pass filter 203 to provide a signal of frequency F−C, which is mixed with the return signal from the system under test 12 of frequency F in a mixer 204 to yield an output signal having mixing products of C and (2F−C). A low pass filter 205 removes the upper sideband to provide a signal at the fixed frequency C for application to analysing portion 17.

It will be realised that analysis portion 17 has to be capable of fixed frequency (C) operation only and that frequency response analysis may be performed at the increased frequency F based upon a signal generator portion delivering a signal of frequency only F/K. It will thus further be realised that components of the the present embodiment may be used in conjunction with a prior art frequency response analyser serving to provide signal generator portion 10 and analysing portion 17. Since the analyser portion of such a prior art frequency response analysis will require a reference signal, the output of generator 27 (of frequency C) may be supplied so that an effectively fixed frequency analysing portion may be provided.

It will be appreciated that in the present embodiment offset VCO's are employed, avoiding the problem of providing a VCO based signal generator capable of running at very low frequencies. A broad band high frequency frequency response analyser is therefore provided. It will further be appreciated that the use of offset eases the performance requirements of low pass filters 24 and 203, since in each case the upper sideband to be filtered is translated by twice the offset frequency.

An embodiment of the present invention has been constructed capable of testing in the range 0–32 MHz (F) with an offset frequency (L) of 60 MHz and an analysing frequency (C) of 393.216 Hz, values of K being 10, 100, or 1000 dependant upon the actual testing range selected. Signal synthesizer maximum frequency (F/K) may thus be only 65 kHz.

We claim:

1. A frequency response analyser for testing the response of a system under test at a relatively higher frequency F having a signal generator portion capable of generating a reference signal at a relatively lower frequency F/K including:

a phase locked loop comprising a phase sensitive detector to which the reference signal is applied at a reference input, a voltage controlled oscillator arranged to provide a signal of a frequency being a multiple of the reference signal frequency, but offset in frequency and a divider for dividing by said multiple to generate a signal of frequency F/K from a signal of frequency F connected to a comparison input of the voltage controlled oscillator, means for generating a fixed frequency signal of the frequency offset of the voltage controlled oscillator, mixing means intermediate the voltage controlled oscillator and divider of the phase locked loop arranged to receive the fixed frequency at its mixing input, the output of the mixing means being provided to the system under test, means for generating a second signal of constant frequency, being a frequency of operation of an analysing portion of the frequency response analyser offset by an amount equal to the offset of the voltage controlled oscillator output, second mixing means arranged to receive said second signal and the voltage controlled oscillator output signal, and, third mixing means arranged to receive the output of said second mixing means and a signal from the system under test, the third mixing means providing an output for analysis of frequency C to said analysing portion.

2. A frequency response analyser as claimed in claim 1 and wherein the means for generating said second signal comprises a second phase locked loop having a second phase sensitive detector receiving a signal of said analysing freqency C, and a second voltage controlled oscillator arranged to provide a signal offset in frequency in response to an error signal received from the second phase sensitive detector, the error signal being generated by applying to the comparison input of the second phase sensitive at its inputs the output of the second voltage controlled oscillator and the fixed frequency signal of the offset frequency, L.

* * * * *